(12) United States Patent
Yada et al.

(10) Patent No.: US 6,266,294 B1
(45) Date of Patent: *Jul. 24, 2001

(54) INTEGRATED CIRCUIT DEVICE

(75) Inventors: Masahiro Yada; Hiroyoshi Tomita, both of Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/304,516

(22) Filed: May 4, 1999

(30) Foreign Application Priority Data

Jun. 30, 1998 (JP) .................................. 10-184483

(51) Int. Cl.⁷ ..................................... G11C 8/00
(52) U.S. Cl. ........................... 365/233; 365/226; 327/198
(58) Field of Search ............................... 365/233, 230.01, 365/226; 327/198–276, 141, 161

(56) References Cited

U.S. PATENT DOCUMENTS

| | | | |
|---|---|---|---|
| 5,923,198 | * | 7/1999 | Fujioka ................. 327/262 |
| 5,935,257 | * | 8/1999 | Nishimura ............. 327/161 |
| 5,990,730 | * | 8/1999 | Shinozaka ............. 327/544 |

* cited by examiner

Primary Examiner—A. Zarabian
(74) Attorney, Agent, or Firm—Arent Fox Kintner Plotkin & Kahn, PLLC (57) ABSTRACT

According to the present invention, in an integrated circuit device for receiving an external clock signal and a clock enable signal and for supplying to an internal circuit an internal clock signal which has a predetermined phase relationship with the external clock signal, a DLL circuit for generating a delay clock signal, synchronized and in phase with the external clock signal, is operated continuously even in a low power consumption mode, and the provision of the delay clock signal to the internal circuit is halted. When the mode is switched from the low power consumption mode to the normal mode, the delay clock signal generated by the DLL circuit, which is operated continuously, is supplied as an internal clock signal to the internal circuit again.

6 Claims, 7 Drawing Sheets

FIG. 1

FIG. 2
Internal clock output circuit
102

FIG. 3
DLL

FIG. 4
CKE timing controller

FIG. 5
Timing chart of internal clock output circuit

INTEGRATED CIRCUIT DEVICE

BACKGROUND OF THE INVENTION

1. Field of the Invention

The present invention relates to an integrated circuit device including a circuit for outputting an internal clock signal which has a predetermined phase relationship with a received clock signal. In particular, the present invention relates to an integrated circuit device which includes an internal clock output circuit for performing at high speed a mode switch from a low power consumption mode to a normal mode.

2. Related Arts

Recently the attention has been drawn to a synchronous DRAM (SDRAM), as a dynamic random access memory (DRAM) operating in synchronization with a system clock. An SDRAM receives and stores signals, such as addresses, data or commands, and reads and outputs data signals in synchronized with an external clock output by a system, so that a high speed operation is possible.

As the processing speed of an SDRAM is increased, the phase of an internal clock, which is generated by internally fetching an external clock, is shifted relative to the external clock. Thus, an internal clock signal may not be employed as a strobe signal for receiving the address signal, the data signal or the command signal, or for outputting an output data signal.

To compensate for the phase shifting, a delay locked loop circuit (hereinafter referred to simply as a DLL circuit), for example, generates an internal clock, which is synchronized and in phase with the external clock or so that its phase differs from that of the external clock by a predetermined amount. Then, the input address signal and another signals are fetched and a data signal is output at the timing for the internal clock.

The increase in the speed of the clock increases the frequency at which data is written to and read from the SDRAM and results in an increase in the power consumed by the SDRAM. Therefore, a low power consumption mode is provided for halting the internal operation of the SDRAM when no access is being performed. In the low power consumption mode, a clock enable signal is rendered inactive (level L) so as to inhibit the fetching of an external clock signal at an input buffer and to halt all unneeded internal operations.

Figure 7:
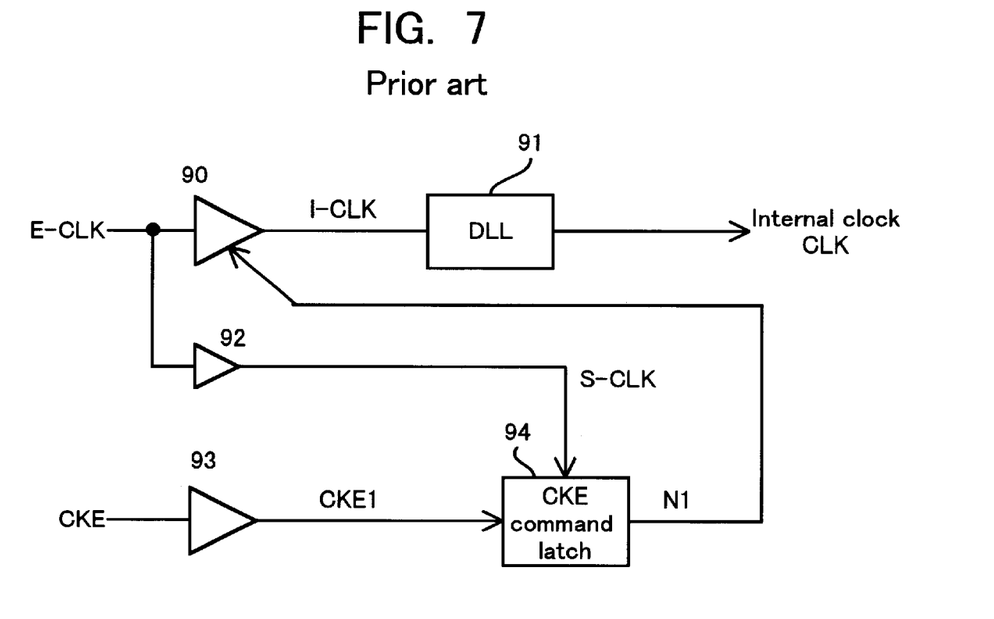
FIG. 7 is a diagram illustrating the arrangement of a conventional internal clock output circuit.

FIG. 7 is a diagram illustrating the arrangement of a conventional internal clock output circuit provided for an SDRAM. An external clock signal E-CLK is transmitted to an input buffer 90, and its waveform is shaped to obtain a clock signal I-CLK. A phase difference that corresponds to the delay time for the input buffer 90 occurs between the clock signal I-CLK and the external clock signal E-CLK.

The clock signal I-CLK is transmitted to a DLL circuit 91. The DLL circuit 91 transmits as a strobe signal an internal clock signal CLK, which is synchronized and in phase with the external clock signal E-CLK, to an address buffer (not shown). The external clock signal E-CLK is also transmitted to a small buffer 92, and the small buffer 92 outputs a clock signal S-CLK, which is a data fetch signal for a CKE command latch circuit 94.

The clock enable signal CKE is a signal used for determining whether an external clock signal E-CLK should be fetched. The clock enable signal CKE is transmitted to an input buffer 93 and is changed to a clock enable signal CKE1, which is then output to a CKE command latch circuit 94. The CKE command latch circuit 94 fetches the clock enable signal CKE1 at the rising edge of the clock signal S-CLK, and generates a clock output control signal N1 for providing to the input buffer 90 as a strobe signal.

The input buffer 90 is rendered inactive when the clock output control signal N1 goes to level L and halts the output of the clock signal I-CLK. When the transmission of the clock signal I-CLK is halted, the DLL circuit 91 halts the output of the internal clock signal CLK. As a result, all internal operations are halted and the mode of the SDRAM is switched to the low power consumption mode.

However, when in the low power consumption mode, the input buffer 90 is rendered inactive and the fetching of the external clock signal E-CLK is inhibited, the feedback operation of the DLL circuit 91 is also halted. Once a DLL circuit 91 has been halted in the low power consumption mode, when returning to the normal mode, an extended period of time is required for the DLL circuit 91 to shift from the unlocked state to the locked state, and writing to and reading from the SDRAM can not be performed during this shifting period.

As the speed of an SDRAM is increased, an active power-down mode is necessary in which the operation of the DLL circuit 91 continues, even in the low power consumption mode, but the partial internal operation of the SDRAM is halted. The locked state of the DLL circuit is maintained in the active power-down mode, and when the mode of the SDRAM is switched to the normal mode, a normal operation can be initiated quickly. In this case, if the fetching of the external clock signal E-CLK in the input buffer 90 is halted, accordingly, the DLL circuit 91 is halted, and this is not preferable.

The clock enable signal CKE for shifting the system mode to the low power consumption mode is generated asynchronously with the external clock signal E-CLK, and is transmitted to the internal clock output circuit. Therefore, the falling and the rising edge timings of the clock output control signal N1, which is generated by the CKE command latch circuit 94, are unsynchronized with those of the internal clock signal CLK output by the DLL circuit 91.

Therefore, at the power down entry time, whereat the mode is switched from the normal to the low power consumption mode, and at the power down eject time, whereat the mode is switched from the low power consumption mode to the normal mode, the internal clock signal CLK having a width smaller than a predetermined pulse width would be output depending on the input timing of the clock enable signal CKE.

When the internal clock signal CLK without having the predetermined pulse width is provided into the SDRAM, a normal operation of SDRAM based on the internal clock signal CLK having the predetermined pulse width can not be preformed so that a reliability is deteriorated.

SUMMARY OF THE INVENTION

It is, therefore, one objective of the present invention to provide an integrated circuit device having an internal clock output circuit which can increase the operating speed of switching from a low power consumption mode to a normal mode.

It is another objective of the present invention to provide an integrated circuit device having an internal clock output circuit which does not generate an internal lock signal having an insufficient pulse width.

To achieve the objectives, according to the present invention, in an integrated circuit device for receiving an external clock signal and a clock enable signal and for supplying to an internal circuit an internal clock signal which has a predetermined phase relationship with the external clock signal, a DLL circuit for generating a delay clock signal, synchronized and in phase with the external clock signal, is operated continuously even in a low power consumption mode, and the supply of the delay clock signal to the internal circuit is halted. When the mode is switched from the low power consumption mode to the normal mode, the delay clock signal generated by the DLL circuit, which is operated continuously, is supplied as an internal clock signal to the internal circuit again.

According to the present invention, the DLL circuit continues its operation to generate the delay clock signal even in the low power consumption mode. Therefore, when the mode is switched from the low power consumption mode to the normal mode, the DLL circuit is already in the locked state. As a result, the internal clock signal, synchronized and in phase with the external clock signal, can be immediately supplied to the internal circuit, and the integrated circuit device can be quickly shifted to the writing and reading enabled state.

Furthermore, to achieve the above objectives, according to the present invention, in an integrated circuit device, for receiving an external clock signal and a clock enable signal and for supplying, to an internal circuit, an internal clock signal which has a predetermined phase relationship with the external clock signal, a clock output control signal used for determining whether the internal clock signal is to be supplied to the internal circuit is generated at the timing having a predetermined phase relationship with a delay clock signal. A gate circuit supplies or halt to supply the internal clock signal to the internal circuit in response to the clock output control signal.

According to the present invention, the clock output control signal is transmitted to the gate circuit in accordance with the predetermined phase relationship with the delay clock signal, for example, in synchronization with the falling edge timing. Therefore, when the mode is switched from the normal mode to the low power consumption mode, or when it is switched from the low power consumption mode to the normal mode, the internal clock signal has an adequate pulse width so that the erroneous operation of the integrated circuit device is prevented, and the reliability of the SDRAM is improved.

DETAILED DESCRIPTION OF THE PREFERRED EMBODIMENT

The preferred embodiment of the present invention will now be described. It should be noted, however, that the technical scope of the present invention is not limited to this embodiment.

Figure 1:
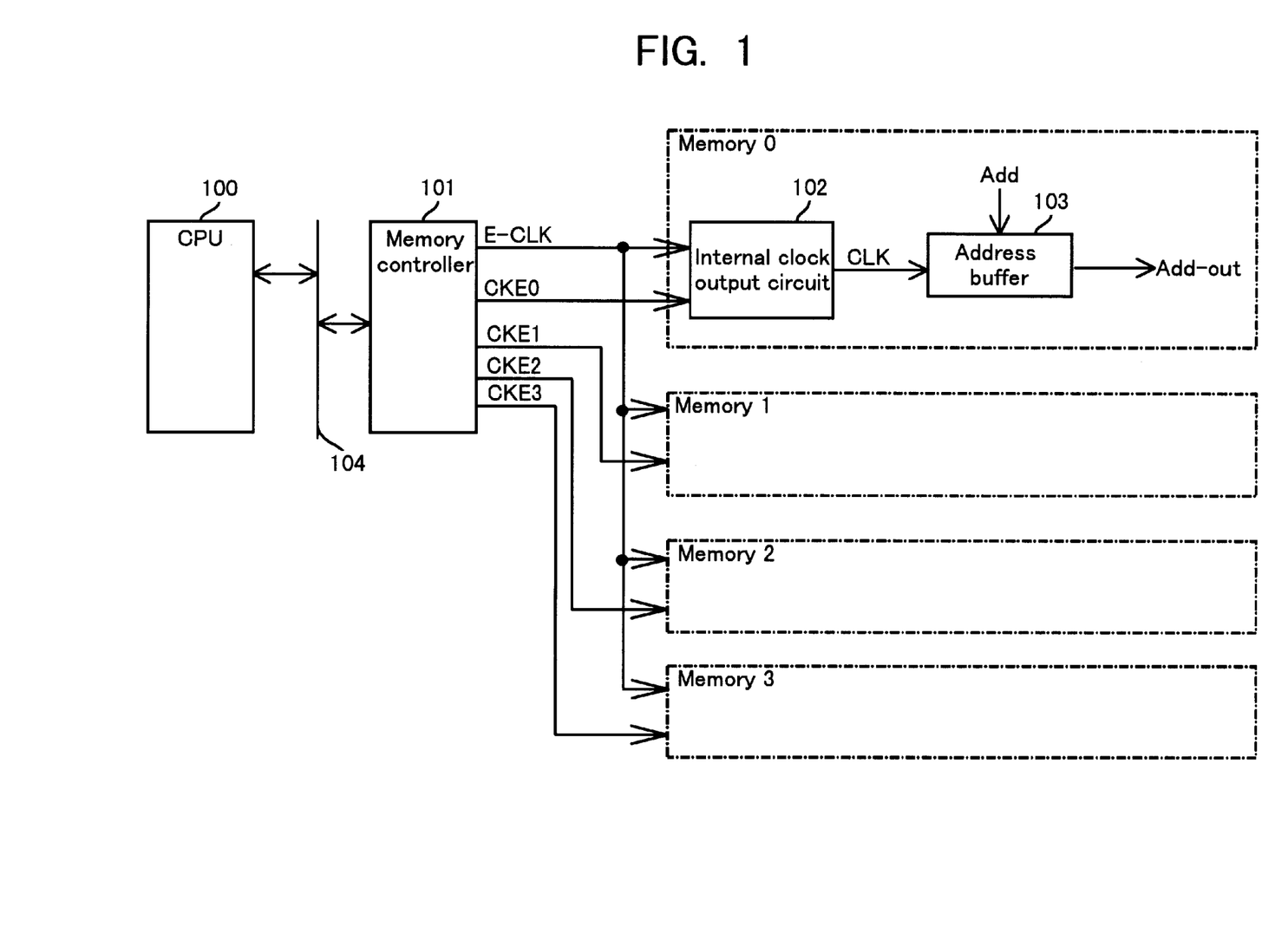
FIG. 1 is a diagram for explaining an integrated circuit device having an internal clock circuit according to one embodiment of the present invention.

FIG. 1 is a diagram showing the integrated circuit devices, each of which has an internal clock output circuit according to one embodiment of the present invention. A CPU 100 accesses memories 0 to 3, which are connected to a memory controller 101 via a bus 104. The memory controller 101 provides an external clock signal E-CLK to the memories 0 to 3, and also provides clock enable signals CKE 0 to 3 for shifting the mode for the memories to the low power consumption mode. The mode for the memories 0 to 3 is set to the normal mode when the clock enable signals CKE 0 to 3 are at level H, and to the low power consumption mode when the clock enable signals CKE 0 to 3 are at level L.

The memories 0 to 3 are, for example, integrated circuit devices, such as SDRAMs, all of which have the same structure. An internal clock output circuit 102 in the memory 0 fetches the external clock signal E-CLK, generates an internal clock signal CLK, which is synchronized and in phase with the external clock signal E-CLK, and, in the normal mode, outputs the internal clock signal CLK to an address buffer 103 for example. The address buffer 103 fetches an external address signal Add and outputs an address signal Add-out in synchronization with the internal clock signal CLK.

A clock enable signal CKE0 is also provided to the internal clock output circuit 102. When the clock enable signal CKE0 goes to level L, the internal clock output circuit 102 halts the output of the internal clock signal CLK, and halts the operation of the address buffer 102 in order to shift the mode for memory 0 to the low power consumption mode.

When the clock enable signal CKE0 goes to level H, the provision of the internal clock signal CLK is initiated and the mode is switched from the low power consumption mode to the normal mode. In this embodiment, when the mode is switched from low power consumption mode to the normal mode, the internal clock output circuit 102 can immediately output the internal clock signal CLK, which is synchronized and in phase with the external clock signal E-CLK, so that the recovery speed can be increased at which the mode for memory 0 is switched to the normal mode.

In addition, in this embodiment, when the mode is switched from the normal mode to the low power consumption mode, or vice versa, an internal clock signal CLK having an adequate pulse width is output. Thus, an erroneous operation in the address buffer 103 can be prevented and the reliability of the SDRAM improved.

Figure 2:
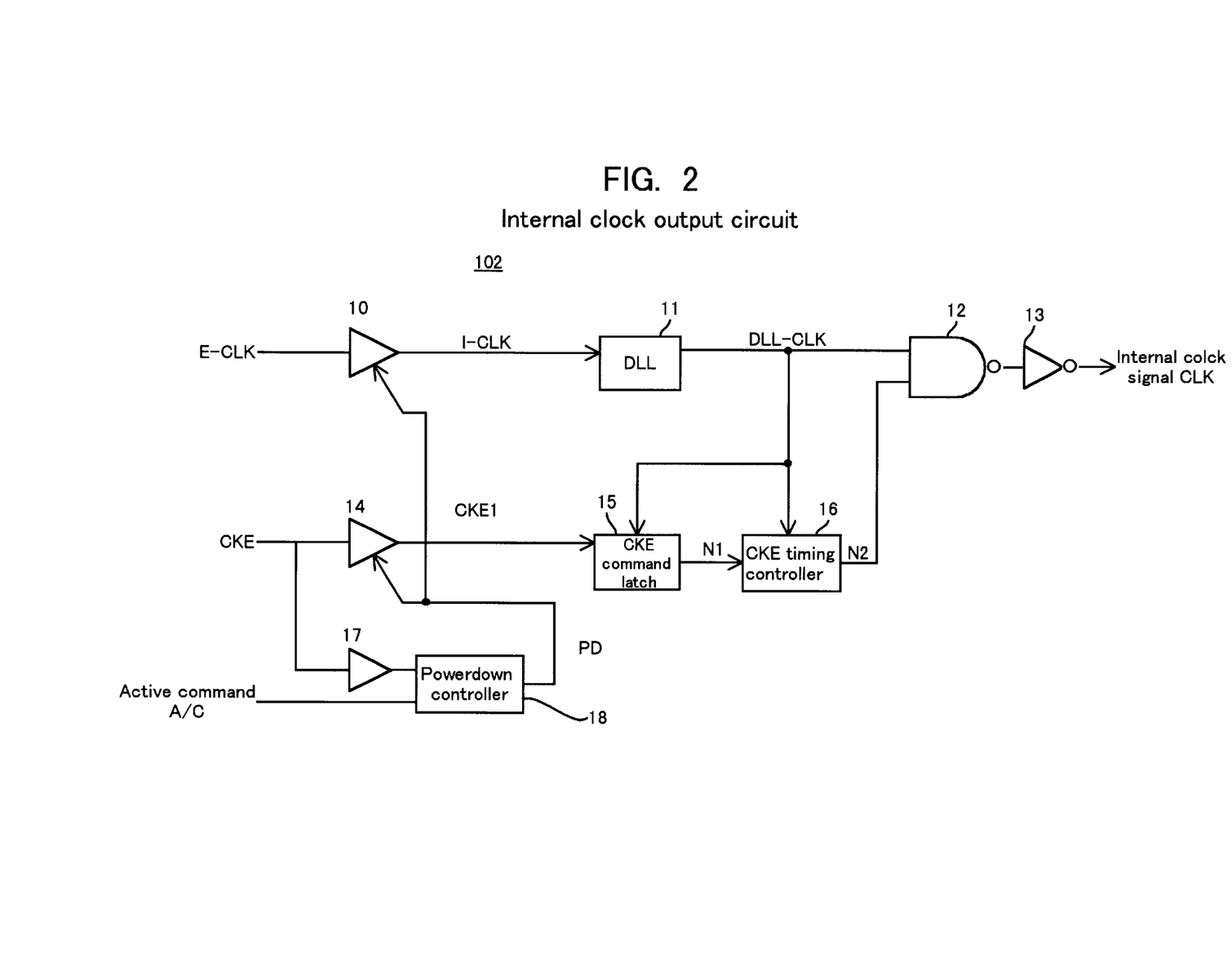
FIG. 2 is a diagram illustrating the arrangement of an internal clock output circuit according to the embodiment of the present invention.

FIG. 2 is a diagram illustrating the arrangement of the internal clock output circuit 102 according to the embodiment of the present invention. First, an explanation will be given for the active power down mode in which the provision of the internal clock signal CLK is halted in response to the clock enable signal CKE.

In the active power down mode, an active command AC is received from a memory controller and the clock enable signal CKE goes to level L. As a result, even when the clock enable signal CKE is at level L, a power down controller 18 renders activation signal PD active, and maintains the active states of the input buffers 10 and 14.

The external clock signal E-CLK is provided to the input buffer 10, and its waveform is shaped to obtain a clock signal I-CLK. A delay corresponding to the delay time for the input buffer 10 exists between the clock signal I-CLK and the external clock signal E-CLK.

The clock signal I-CLK is input to a DLL circuit 11. The DLL circuit 11 generates a delay clock signal DLL-CLK, which is synchronized and in phase with the external clock signal E-CLK. The delay clock signal DLL-CLK is output to a NAND circuit 12, and also to a CKE command latch circuit 15 and a CKE timing controller 16.

The clock enable signal CKE is provided to an input buffer 14, and its waveform is shaped to obtain a clock enable signal CKE1. A delay corresponding to the delay time for the input buffer 14 also exists between the clock enable signal CKE1 and the clock enable signal CKE.

The clock enable signal CKE1 is provided to the CKE command latch circuit 15. The command latch circuit 15 fetches the clock enable signal CKE1 at the rising edge timing of the delay clock signal DLL-CLK, and outputs a latch signal N1.

The latch signal N1 is transmitted to the CKE timing controller 16. The CKE timing controller 16 latches the latch signal N1 when the delay clock signal DLL-CLK is at level H, while holding it and outputting a clock output control signal N2 to an NAND circuit 12 when the delay clock signal DLL-CLK is at level L.

The NAND circuit 12 employs the clock output control signal N2 to determine whether to output the delay clock signal DLL-CLK as an internal clock signal CLK. When the clock output control signal N2 is at level H, the delay clock signal DLL-CLK is passed through the NAND circuit 12 and is inverted at an inverter 13 to obtain an internal clock signal CLK. The internal clock signal CLK is then provided to the address buffer of the SDRAM. When the clock output control signal N2 is at level L, the delay clock signal DLL-CLK can not be passed through the NAND circuit 12, and an internal clock signal CLK is not provided to the address buffer of the SDRAM.

As is described above, according to this embodiment, in the active power down mode wherein the active command AC is supplied and the clock enable signal CKE goes to level L, the DLL circuit of the internal clock output circuit 102 continuously generates the delay clock signal DLL-CLK, which is synchronized and in phase with the external clock signal E-CLK. Therefore, when the active power down mode is switched to the normal mode, signal CLK, which is synchronized and in phase with the external clock signal E-CLK, can be immediately provided to the address buffer or another internal circuits, and the SDRAM can be quickly shifted to the writing or reading enabled state.

Furthermore, the clock output control signal N2 is provided to the NAND circuit 12 in synchronization with the timing of the falling edge of the delay clock signal DLL-CLK. Therefore, when the normal mode is switched to the active power down mode, or vice versa, provision of the internal clock signal CLK is halted or initiated beginning at the next rising edge timing for the delay clock signal DLL-CLK. As a result, an insufficient pulse width is not provided for the internal clock signal CLK, the erroneous operation of the SDRAM can be prevented, and the reliability of the SDRAM can be improved.

As is described above, in the active power down mode, the input buffers 10 and 14 and the DLL circuit 11 continue their active operation, and the provision of the internal clock signal CLK is halted in accordance with the clock enable signal CKE. In order to further reduce the consumption of power, a standby power mode is additionally provided to halt the operations of the input buffers 10 and 14 and the DLL circuit 11.

In the standby power down mode, the clock enable signal CKE goes to level L, while the active command AC is not provided by the memory controller. As a result, the power down controller 18 renders the activation signal PD inactive. Therefore, the input buffers 10 and 14 are deactivated, and since the clock signal I-CLK is not provided, the operation of the DLL circuit 11 is also halted. Thus, in the standby power down mode, power consumption is reduced more than it is in the active power down mode.

In addition, since the input buffer 14 is inactive in the standby power down mode, a small buffer 17 is used to detect the change to level H of the clock enable signal CKE. As a result, the power down controller 18 again renders the activation signal PD active so as to activate the input buffers 10 and 14. As soon as the operation of the DLL circuit 11 is resumed, the NAND circuit 12 is opened and the internal clock signal CLK is provided to another input buffer or another internal circuit via the inverter 13.

Figure 3:
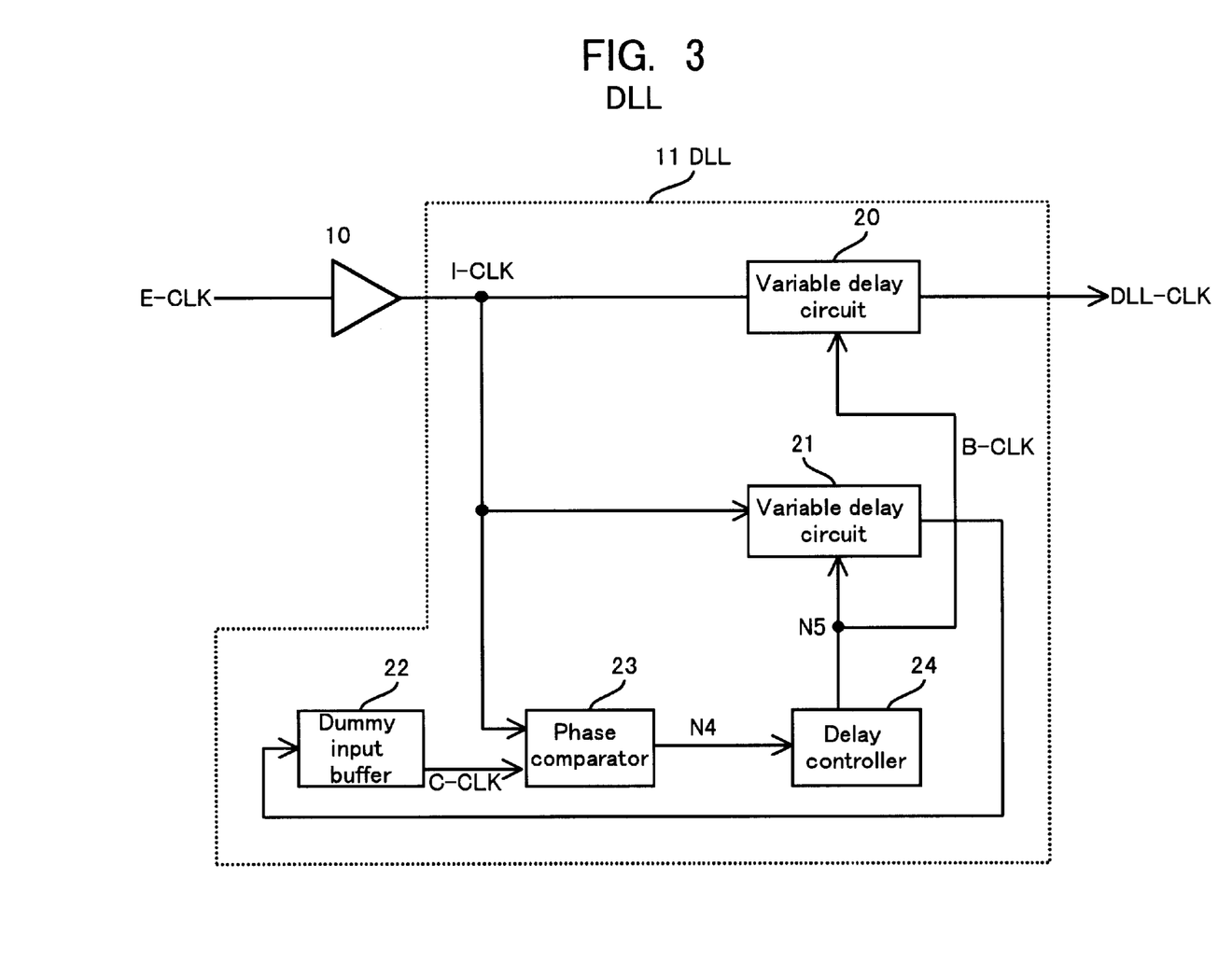
FIG. 3 is a diagram illustrating the arrangement of a DLL circuit according to the embodiment of the present invention.

FIG. 3 is a diagram illustrating the arrangement of the DLL circuit 11 incorporated in the internal clock output circuit 102 according to the embodiment of the present invention. The DLL circuit 11 includes variable delay circuits 20 and 21, each of which has the same delay characteristic. A delay value for the variable delay circuit 20 is controlled to be optimal, so that a delay clock signal DLL-CLK is generated which is synchronized and in phase with the external clock signal E-CLK.

The external clock signal E-CLK is changed into a clock signal I-CLK via the input buffer 10, and the clock signal I-CLK is provided to the DLL circuit 11. The clock signal I-CLK is provided to the variable delay circuits 20 and 21 and also to a phase comparator 23.

A clock signal B-CLK output by the variable delay circuit 21 is provided, via a dummy input buffer 22, to the phase comparator 23 as a clock signal C-CLK. The phase comparator 23 compares the phase of the clock signal I-CLK with that of the clock signal C-CLK, and outputs a phase comparison signal N4 to a delay controller 24. The delay controller 24 outputs a delay control signal N5 to the variable delay circuits 20 and 21 and controls their delay values, so that the phases of the clock signals I-CLK and C-CLK are matched. That is, the delay value of the variable delay circuits 20 and 21 is period obtained by subtracting the delay time for the input buffer 10 from the period for one cycle of the external clock signal E-CLK.

Included in each of the variable delay circuits 20 and 21 is a series connection composed of multiple delay gates, and the number of delay gates through which a signal is passed is controlled by the delay control signal N5. Since the variable delay circuits 20 and 21 are so controlled by the delay control signal N5 that they each provide the same delay value, provides, the received clock signal I-CLK delays through the variable delay circuit 20 with a delay value at which the delay clock signal DLL-CLK is synchronized and in phase with the external clock signal E-CLK. The resultant clock signal DLL-CLK is then output by the DLL circuit 11. Therefore, so long as the DLL circuit 11 receives the clock signal I-CLK, it continues to perform the phase comparison and delay control operations.

Figure 4:
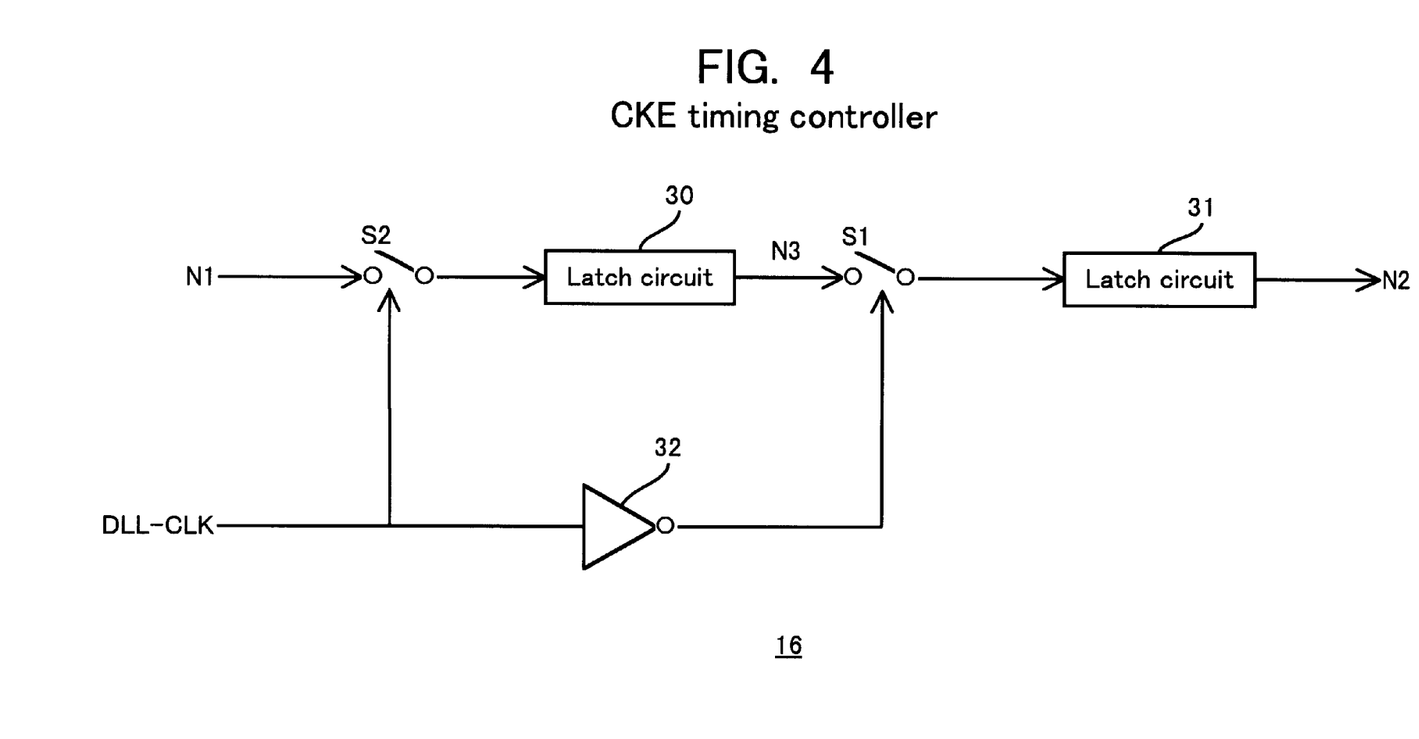
FIG. 4 is a diagram illustrating the arrangement of a CKE timing controller according to the embodiment of the present invention.

FIG. 4 is a diagram illustrating the arrangement of the timing controller 16 incorporated in the internal clock output circuit 102 according to the embodiment of the present invention. As is shown in FIG. 2, a clock enable signal CKE is changed into a clock enable signal CKE1 by passing through the input buffer 14, and the clock signal CKE1 is provided to the CKE command latch circuit 15. The clock enable signal CKE1 is fetched by the CKE command latch circuit 15 at the leading edge of the delay clock signal DLL-CLK, and is transmitted as a latch signal N1 to a switch S2 in FIG. 4.

The switch S2 is maintained ON state during a period in which the delay clock signal DLL-CLK is at level H, and the latch signal N1 is transmitted to a latch circuit 30. Thus, the latch circuit 30 receives the latch signal N1 when the delay clock signal DLL-CLK is changed from level L to level H, and holds the latch signal N1 at the change of the delay clock signal DLL-CLK from level H to level L.

The signal N3 is output by the latch circuit 30 to a switch S1. The switch S1 is controlled by a signal which is obtained through the inversion of the delay clock signal DLL-CLK by an inverter 32. The switch S1 is maintained ON state during a period in which the delay clock signal DLL-CLK is at level L. Therefore, the latch circuit 31 receives the signal N3 when the delay clock signal DLL-CLK is changed from level H to level L, and holds the signal N3 at the change of the delay clock signal DLL-CLK from level L to level H. Finally, the latch circuit 31 outputs the internal clock output control signal N2 to the NAND circuit 12 as shown in FIG. 2.

In FIG. 4 the signal N1 is received at the rising edge of the delay clock signal DLL-CLK and the signal N3 is generated. However, in case where a delay time of the CKE command latch circuit 15 in FIG. 2 is long, the switch S2 and the latch circuit 30 may be omitted and the signal N1 may be directly provided to the switch S1.

Figure 5:
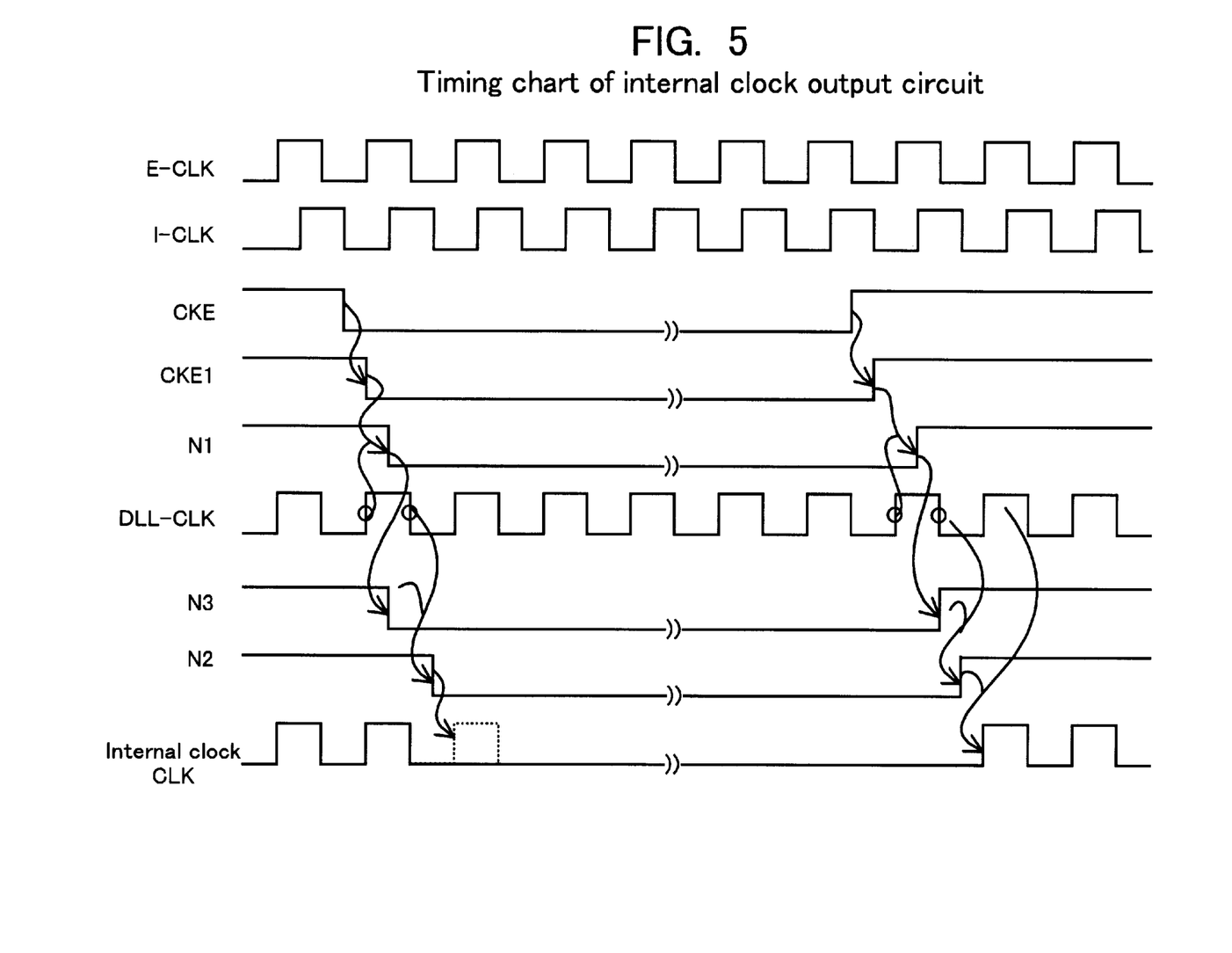
FIG. 5 is a time chart for the internal clock circuit according to the embodiment of the present invention.

FIG. 5 is a time chart for the internal clock output circuit 102 according to the embodiment of the present invention. The operation of the internal clock output circuit 102 will now be described while referring to FIGS. 2, 4 and 5.

The external clock signal E-CLK is delayed a period equivalent to the delay time for the input buffer 10, and is changed into the clock signal I-CLK. The clock enable signal CKE is received asynchronous with the external clock signal E-CLK, and is delayed a period equivalent to the delay time for the input buffer 14, thereby producing the clock enable signal CKE1. The period during which the clock enable signal CKE is at level H constitutes the normal mode, and the period during which the clock enable signal CKE is at level L constitutes the low power consumption mode.

The clock signal I-CLK is provided to the DLL circuit 11, and is changed to the delay clock signal DLL-CLK, which is synchronized and in phase with the external clock E-CLK. The clock enable signal CKE1 is provided to the CKE command latch circuit 15, and is fetched to become the latch signal N1 at the rising edge timing of the delay clock signal DLL-CLK.

The latch signal N1 is provided to the switch S2 (see FIG. 4) in the CKE timing controller 16. Since the switch S2 is ON state during a period in which the delay clock signal DLL-CLK is at level H, the latch circuit 30 latches the signal N1 at the change of the delay clock signal DLL-CLK from level H to level L. The output of the latch circuit 30 is the signal N3.

The signal N3 is provided to the switch S1. Since the switch S1 is ON state during a period in which the delay clock signal DLL-CLK is at level L, the latch circuit 31 latches the signal N3 at the change of the delay clock signal DLL-CLK from level L to level H. The output of the latch circuit 31 is the clock output control signal N2. When the clock output control signal N2 goes to level L, the output by the NAND circuit 12 of the internal clock signal CLK is halted.

As is described above, even in the low power consumption mode, the internal clock output circuit 102 of the embodiment generates a delay clock signal DLL-CLK which is synchronized and in phase with the external clock signal E-CLK. Therefore, when the low power consumption mode is switched to the normal mode, the internal clock signal CLK, which is synchronized and in phase with the external clock signal E-CLK, can be output immediately. As a result, when the switch to the normal mode is effected, the speed of the writing and reading operation of the SDRAM can be increased.

Further, the clock output control signal N2 is output in synchronization with the timing of the falling edge of the delay clock signal DLL-CLK. Therefore, when the mode is switched for the normal mode to the low power consumption mode, or vice versa, the internal clock signal CLK does not have an insufficient pulse width. As a result, an erroneous operation in the address buffer to which the internal clock signal CLK is provided can be prevented, and the reliability of the SDRAM can be increased.

Figure 6:
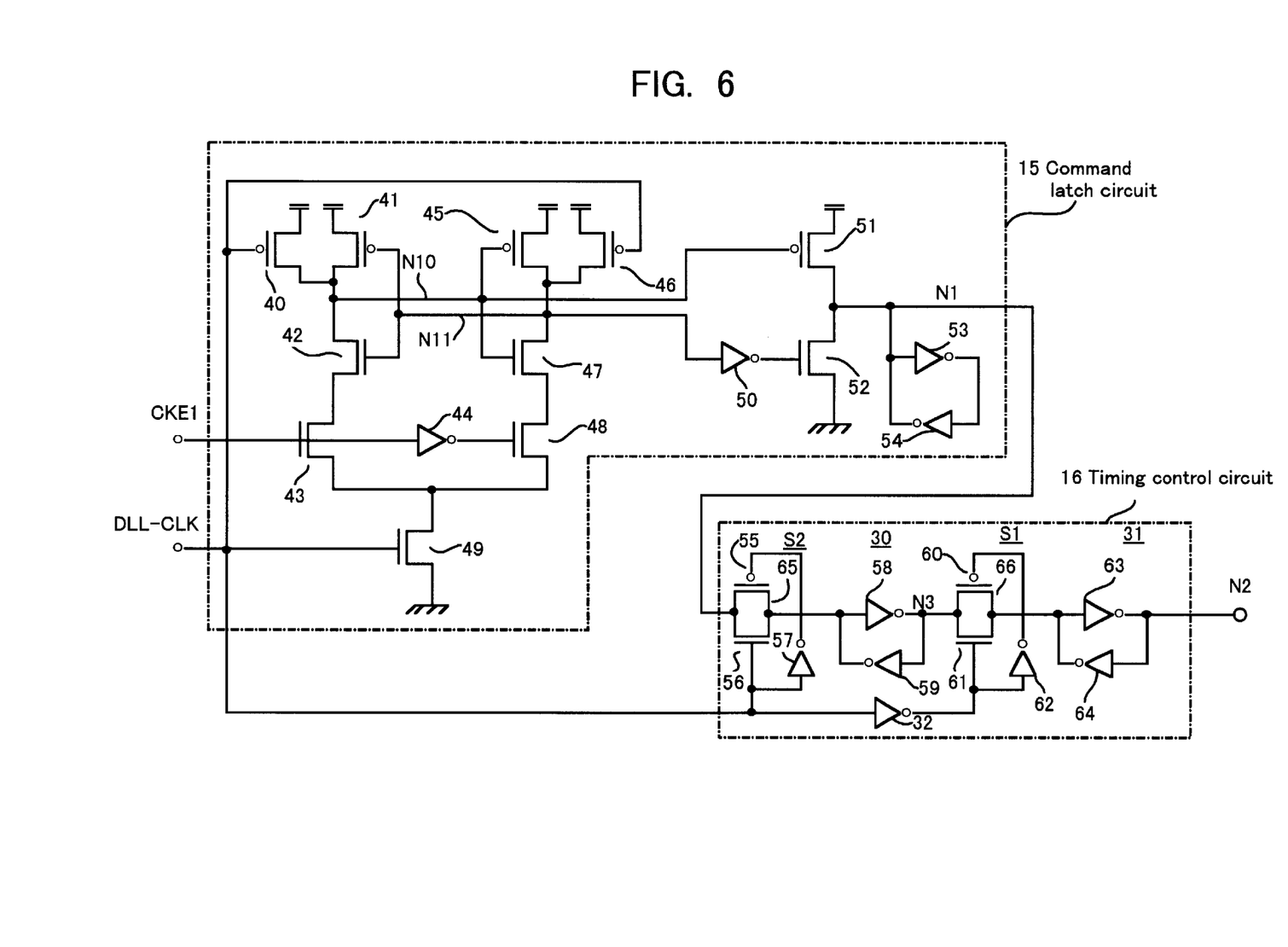
FIG. 6 is a circuit diagram illustrating a CKE command latch circuit and a CKE timing controller according to the embodiment of the present invention.

FIG. 6 is a circuit diagram for the CKE command latch circuit 15 and the CKE timing controller 16 according to the embodiment of the present invention. The CKE command latch circuit 15 comprises P channel transistors 40, 41, 45, 46 and 51; N channel transistors 42, 43, 47, 48, 49 and 52; and inverters 44, 50, 53 and 54. The CKE command latch circuit 15 latches the clock enable signal CKE1 at the rising edge timing of the delay clock signal DLL-CLK, and outputs the latch signal N1.

When the delay clock signal DLL-CLK is at level L, the N channel transistor 49 is rendered off, and the P channel transistors 40 and 46 are turned on, so that nodes N10 and N11 are at level H. Then, the P channel transistor 51 and the N channel transistor 52 are turned off, and node N1 is set to a high impedance state. Since the nodes N10 and N11 are at level H, the N channel transistors 42 and 47 are turned on.

When the delay clock signal DLL-CLK goes to level H, the N channel transistor 49 is turned on. When at this time the clock enable signal CKE1 is at level L, the gate of the N channel transistor 48 is raised to level H by the inverter 44. As a result, the N channel transistor 48 is rendered on to drop the node N11 to level L. When the clock enable signal CKE1 is at level H, the N channel transistor 43 is rendered on to drop the node N10 to level L. When the node N10 or N11 goes to level L, the P channel transistor 45 or 41 is rendered on, and the opposite node N11 or N10 is set to level H.

When the node N10 is at level L and the node N11 is at level H, the P channel transistor 51 is rendered on and the N channel transistor 52 is rendered off. The node N1 is set to level H and is latched by the inverters 53 and 54. On the other hand, when the node N10 is at level H and the node N11 is at level L, the P channel transistor 51 is rendered off and the N channel transistor 52 is rendered on. The node N1 is set to level L, and is latched by the inverters 53 and 54.

The CKE timing controller 16 comprises: a transfer gate 65, which is constituted by a P channel transistor 55 and an N channel transistor 56; a transfer gate 66, which is constituted by a P channel transistor 60 and an N channel transistor 61; and inverters 32, 57 to 59 and 62 to 64. The transfer gate 65 and the inverter 57 correspond to the switch S2 in FIG. 4, and the transfer gate 66 and the inverter 62 correspond to the switch S1 in FIG. 4. The inverters 58 and 59 correspond to the latch circuit 30 shown in FIG. 4, and the inverters 63 and 64 correspond to the latch circuit 31 in FIG. 4.

The latch signal N1 is provided by the CKE command latch circuit 15 to the transfer gate 65. In a period during which the delay clock signal DLL-CLK is at level H, the latch signal N1 is passed through the transfer gate 65, and is latched by the latch circuit 30 for output as the signal N3.

The signal N3 is provided to the transfer gate 66 and is passed through it during a period in which the delay clock signal DLL-CLK is at level L. The signal N3 is latched by the latch circuit 31 and is changed to a clock output control signal N2. The clock output control signal N2 is used by the NAND circuit 12 to determine whether to output the internal clock signal CLX.

As is described above, according to the embodiment of the present invention, when the mode is switched from the normal mode to the low power consumption mode, the NAND circuit halts the output of the internal clock signal CLK, instead of deactivating the input buffer 10 to halt the fetching of the external clock signal E-CLK.

Therefore, so long as the external clock signal E-CLK is received, the input buffer 10 and the DLL circuit 11 are maintained active and continue to transmit the delay clock signal DLL-CLK to the NAND circuit 12. As a result, when the mode is switched from the low power consumption mode to the normal mode, the phase shifting of the internal clock CLK can be prevented, and the normal operation of the SDRAM can be recovered quickly.

As is explained above, according to the present invention, even in the low power consumption mode the internal clock signal which is synchronized and in phase with the external clock signal is generated continuously. Therefore, when the mode is switched from the low power consumption mode to the normal mode, the internal clock signal, which is synchronized and in phase with the external clock signal, can be immediately supplied, and the speed of the operations performed by the SDRAM can be increased.

In addition, according to the present invention, at the power down entry at which the mode is switched from the normal mode to the low power consumption mode, and at the power down exit at which the mode is switched from the low power consumption mode to the normal mode, the erroneous operation of the SDRAM, due to the provision of an insufficient pulse width for the internal clock signal, can be prevented, and the reliability of the SDRAM can be improved.

What is claimed is:

1. An integrated circuit device, which receives an external clock signal and a clock enable signal and supplies, to an internal circuit, an internal clock signal which has a predetermined phase relationship with the external clock signal, comprising:

a DLL circuit for generating a delay clock signal which has said predetermined relationship with said external clock signal; and a gate circuit for supplying said delay clock signal as said internal clock signal to said internal circuit, or halting the supply of said internal clock signal, in response to said clock enable signal, wherein in an ordinary operation mode, the gate circuit supplies said delay clock signal to said internal circuit, and in a power down mode, the gate circuit halts supplying said delay clock signal to said internal circuit while the DLL circuit remains active.

2. An integrated circuit device, which receives an external clock signal and a clock enable signal and supplies, to an internal circuit, an internal clock signal which has a predetermined phase relationship with the external clock signal, comprising:

a DLL circuit for generating a delay clock signal which has said predetermined relationship with said external clock signal;

a controller for fetching said clock enable signal in response to said delay clock signal, and for generating a clock output control signal; and a gate circuit for supplying said delay clock signal as said internal clock signal to said internal circuit, or halting the supply of said internal clock signal in response to said clock output control signal, wherein in an ordinary operation mode, the gate circuit supplies said delay clock signal to said internal circuit, and in a power down mode, the gate circuit halts supplying said delay clock signal to said internal circuit while the DLL circuit remains active.

3. An integrated circuit device according to claim 2, wherein said controller fetches said clock enable signal at the timing for the first edge of said delay clock signal, and outputs said clock output control signal at the timing for the second edge, which differs from said first edge, of said delay clock signal.

4. An integrated circuit device according to claim 2, wherein said controller includes:

a first latch circuit for fetching said clock enable signal at the timing for said first edge of said delay clock signal; and a second latch circuit for fetching a signal output by said first latch circuit at the timing for said second edge, which differs from said first edge, of said delay clock signal, and for generating said clock output control signal.

5. An integrated circuit device, which receives an external clock signal and a clock enable signal and supplies to an internal circuit an internal clock signal which has a predetermined phase relationship with the external clock signal, comprising:

a clock input buffer for inputting said external clock signal;

a DLL circuit for receiving a clock signal from said clock input buffer, and for generating a delay clock signal which has said predetermined relationship with said external clock signal;

a gate circuit for, in a first power down mode, supplying said delay clock signal as said internal clock signal to said internal circuit, or halting the supply of said internal clock signal in response to said clock enable signal; and a power down controller for, in a second power down mode, deactivating said clock input buffer in response to said clock enable signal.

6. An integrated circuit device, which receives an external clock signal and a clock enable signal and supplies, to an internal circuit, an internal clock signal which has a predetermined phase relationship with the external clock signal, comprising:

a clock input buffer for inputting said external clock signal;

a DLL circuit for receiving a clock signal from said clock input buffer, and for generating a delay clock signal which has said predetermined relationship with said external clock signal;

a gate circuit for, in a first power down mode, supplying said delay clock signal as said internal clock signal to said internal circuit, or halting the supply of said internal clock signal, depending on said clock enable signal and in response to said delay clock signal; and a controller for, in a second power down mode, deactivating said clock input buffer in response to said clock enable signal.

* * * * *